United States Patent [19]

Smith

[11] 4,333,792
[45] Jun. 8, 1982

[54] ENHANCING EPITAXY AND PREFERRED ORIENTATION

[75] Inventor: Henry I. Smith, Sudbury, Mass.

[73] Assignee: Massachusetts Institute of Technology, Cambridge, Mass.

[21] Appl. No.: 28,118

[22] Filed: Apr. 9, 1979

Related U.S. Application Data

[63] Continuation-in-part of Ser. No. 756,358, Jan. 3, 1977, abandoned.

[51] Int. Cl.³ ............................................. C30B 23/04
[52] U.S. Cl. ............................ 156/612; 156/DIG. 88
[58] Field of Search ............ 156/DIG. 80, DIG. 102, 156/DIG. 103, 612, 610, DIG. 88, 621; 148/1.5, 175; 428/609, 620, 538; 427/124, 86

[56] References Cited

U.S. PATENT DOCUMENTS

| | | | |
|---|---|---|---|
| 3,341,361 | 9/1967 | Gorski | 156/DIG.88 |
| 3,549,432 | 12/1970 | Siversten | 156/DIG. 80 |
| 4,099,305 | 7/1978 | Cho et al. | 156/612 |
| 4,174,422 | 11/1979 | Mathews et al. | 156/612 |

FOREIGN PATENT DOCUMENTS 2438588 2/1975 Fed. Rep. of Germany ...... 156/612
2454188 9/1976 Fed. Rep. of Germany .

OTHER PUBLICATIONS

Growth of Crystals v10 Sheftal Consultans Bureau N.Y. 1976 pp. 185–209, 53–61, 39-52.
Soubshehniya Vestnik Moskovskogo Universiteta No. 3, pp. 102–104, 1972.
Sheftal et al. IZV an SSSR Ser. Fia pp. 140–156, 1957 v21.

*Primary Examiner*—Hiram Bernstein
*Attorney, Agent, or Firm*—Arthur A. Smith, Jr.; Charles Hieken

[57] ABSTRACT

An array of oriented artificial relief features or point defects embraced by parallel planes on a substrate surface influence the orientation of solid films during the course of their growth on the substrate surface. There may be multiple sets embraced in generally parallel planes at an angle to each other that is an integral multiple of 30°.

38 Claims, 7 Drawing Figures

SURFACE RELIEF FOR EPITAXY CONTROL

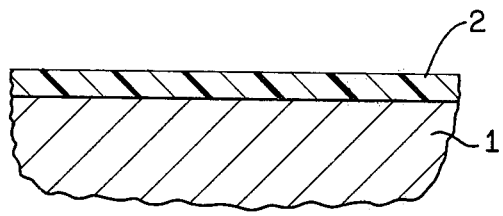
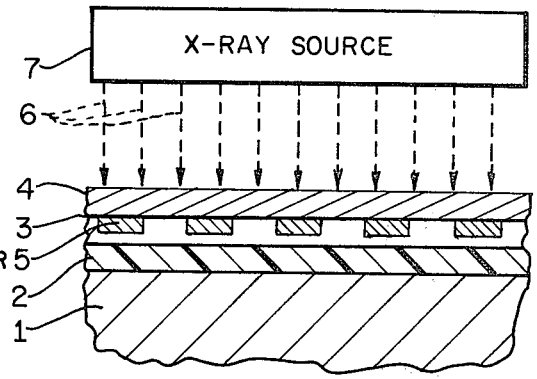
FIG. 1
FIG. 2
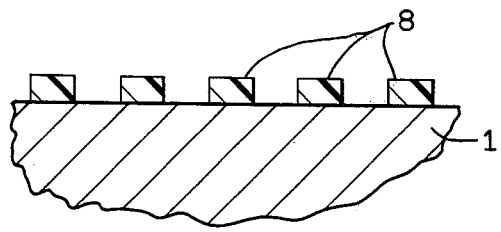
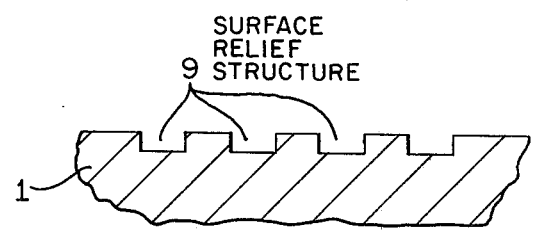
FIG. 3
FIG. 4
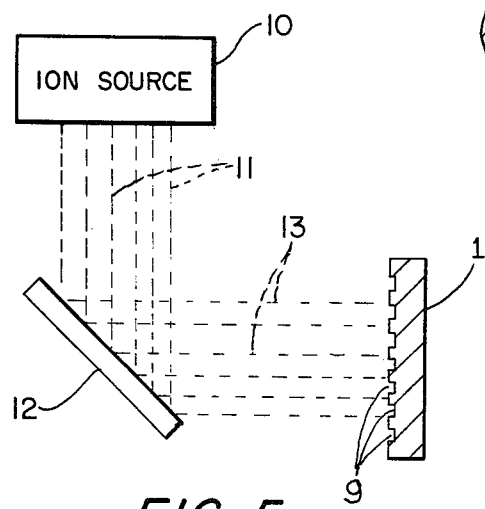
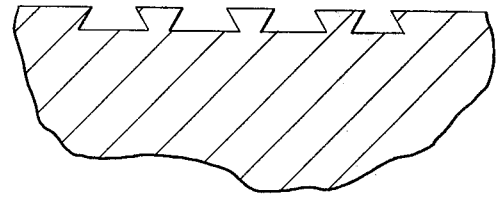
FIG. 5
FIG. 7

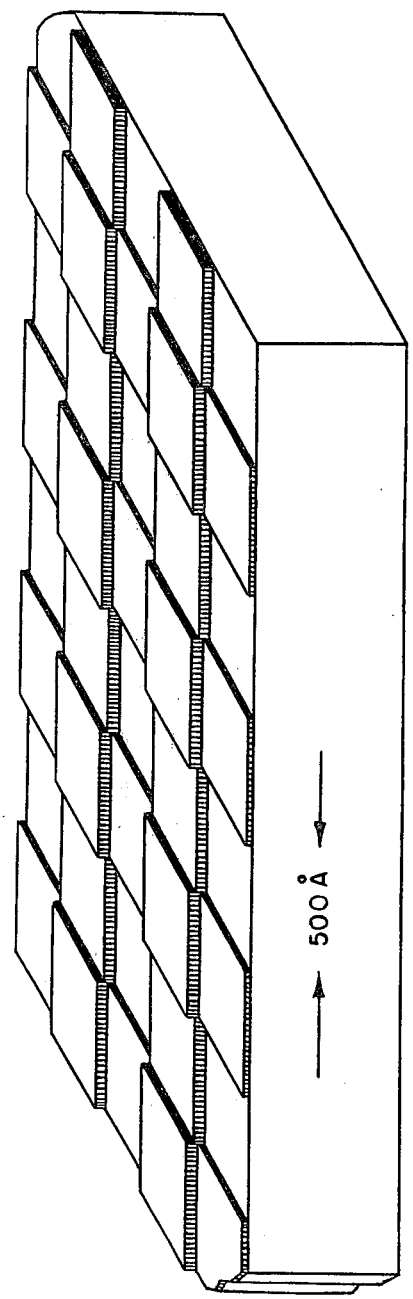
FIG. 6   SURFACE RELIEF FOR EPITAXY CONTROL

ENHANCING EPITAXY AND PREFERRED ORIENTATION

The Government has rights in this invention pursuant to Contract No. AF19(628)-76-C-0002 awarded by the U.S. Department of the Air force.

REFERENCE TO PRIOR APPLICATION

This is a continuation-in-part of application Ser. No. 756,358 filed Jan. 3, 1977, now abandoned.

BACKGROUND OF THE INVENTION

This invention relates in general to improving the crystallographic quality of solid films grown on the surfaces of solid substrates, and more particularly to enhancing epitaxy or preferred orientation to provide relatively large area thin films regularly oriented by means of a practical process.

Much of modern technology makes use of thin solid films on the surfaces of solid substrates. A number of methods have been used to deposit such thin films including thermal evaporation, DC sputtering, rf sputtering, ion beam deposition, chemical vapor deposition, plating, molecular beam deposition and deposition from the liquid phase.

The structure of thin films can be amorphous (that is, the atoms of the film are not arranged in any crystalline order), polycrystalline (that is, the film is composed of many small regions, in each of which the atoms are arranged in a regular crystalline order, but the small regions have no mutual alignment of their crystallographic axes), preferred orientation (that is, the film is composed of many small regions, in each of which the atoms are arranged in a regular crystalline order, and one or more of the crystalline axes of the majority of said small regions are parallel), or epitaxial (that is, the film is predominantly of a single crystallographic orientation). An epitaxial film is a special case of a preferred orientation film in which corresponding crystallographic axes of all the small regions are oriented in the same directions. A thin film can be the same material (that is, the same element or compound) as the substrate, or it can differ in chemical composition from the substrate. If the film is epitaxial, the former is called "homoepitaxy" and the latter "heteroepitaxy."

In general, techniques for obtaining high quality amorphous and polycrystalline films (particularly metals) are well developed and well understood. However, techniques for obtaining high quality epitaxial films and films of preferred orientation are severely limited, and only a limited number of combinations of overlayer film and substrate have been achieved. In most cases, films exhibit a high concentration of crystalline defects [S. T. Picraux, G. T. Thomas, "Correlation of ion channeling and electron microscopy results in the evaluation of heteroepitaxial silicon" J. Appl. Phys. vol 44, pp 594–602 (1973)]. In some cases, high temperatures are required to achieve epitaxy or preferred orientation, and differences in thermal expansion between film and substrate lead to high stresses and sometimes to cracking when samples are cooled to room temperature. Although there are many important technological opportunities for the application of preferred orientation and epitaxial films, particularly in electronic, acoustic, and optical devices, with a few notable exceptions, such films have not been consistently obtained with sufficient quality or in a sufficient number of combinations and orientations to meet the requirements.

Present or conventional methods for obtaining preferred orientation and epitaxial film growth are based on choosing a combination of deposition parameters (such as substrate composition and orientation, deposition method, deposition rate, temperature and pressure) such that the nucleation and growth processes which take place at a microscopic level on the substrate surface favor the growth of the desired film orientation. The fundamental difficulty with this approach is that it is not always possible to control or reproduce all the factors which affect film nucleation and growth. Moreover, this approach limits the number of epitaxial combinations and orientations.

It is an important object of this invention to overcome the shortcomings of conventional methods for producing epitaxial and preferred orientation films and directly influence in a controllable manner the nucleation, growth and orientation of films grown on solid surfaces.

It is another object of this invention to control the crystallographic orientation of thin films grown on solid surfaces in accordance with the preceding object.

It is a further object of this invention to achieve one or more of the preceding objects while reducing the density and magnitude of defects in crystalline thin films grown on solid surfaces.

It is a further object of this invention to achieve one or more of the preceding objects while obtaining epitaxial or preferred orientation films at moderate temperatures and thereby avoid stresses induced by differences in thermal expansion between film and substrate.

This invention results from the discovery that the phenomena of nucleation, growth, and changes in crystallographic orientation that occur during the early stages of film formation on solid surfaces can be influenced and controlled by means of artificial surface relief structures and point defects. It is well known that naturally occurring defects such as steps or point defects on crystal surfaces can act as nucleation sites for deposited material. Some indication of the effects of arrays of point defects on the nucleation and growth of epitaxial films can be found in the work of Distler et al [G. I. Distler, "Epitaxy as a Matrix Replicating Process." Thin Solid Films, vol. 32, pp. 157–162 (1976); G. I. Distler, V. P. Vlasor, V. M. Kaneosky, "Orientational and Long Range Effects in Epitaxy," Thin Solid Films, vol. 33, pp. 287–300 (1976)] who observed that naturally occurring point defects on solid surfaces act as nucleation sites. Distler et al further suggest that the point defects on a surface naturally occur in some form of matrix or lattice and that the orientational effects in epitaxy and crystallization in general are due to the existence of the lattice of point defects.

SUMMARY OF THE INVENTION

According to the invention, one intentionally creates at predetermined locations on a solid surface an array of artificial surface relief steps or artificial point defects and thereby controls in a predetermined way the process of film formation and growth.

The creation of a regular array of surface relief steps or point defects on a solid surface in order to enhance the crystallographic quality of thin solid films grown on said surface is in direct contradiction to conventional methods of thin film growth. Conventional methods attempt to remove, to the fullest extent possible, any natural surface relief steps or point defects. This is usually done by polishing or etching the surface prior to film growth.

The invention includes a process of preparing an array of artificial defects such as surface relief steps or point defects at predetermined locations on a solid surface, and a process for depositing material onto the solid surface in such a way that the crystallographic orientation of the deposited material is controlled by the array of surface relief steps or point defects, more particularly by the geometric arrangement of adjacent defects.

The geometric pattern of the surface relief structure or array of point defects that will be effective for a given combination of overlayer film and substrate and a given deposition method depends on the exact mechanisms of nucleation and growth operable for that combination and deposition method. The geometric pattern will in general be a simple grating or grid with repeating elements spaced by distances of the order of $\frac{1}{2}$ μm or less, although in some cases a repeat distance of 1 μm is adequate. The depth of the surface relief structure can vary from less than one nanometer to of the order of one micrometer. Preferably, there are sets of steps and/or point defects with each set embraced by a plane generally perpendicular to the substrate surface and generally parallel to a plane embracing another set with the angle between intersecting planes being preferably an integral multiple of 30° or $\pi/6$ radians. Numerous other features, objects and advantages of the invention will become apparent from the following specification when read in connection with the accompanying drawing in which:

BRIEF DESCRIPTION OF THE DRAWING

FIG. 1 is a fragmentary sectional view of a solid coated with a thin film of resist;

FIG. 2 is a combined block-sectional view illustrating the use of soft x-rays for forming a controlled relief pattern in a solid substrate according to the invention;

FIG. 3 is a sectional view of the relief pattern formed in the resist;

FIG. 4 is a sectional view illustrating the relief structure following etching;

FIG. 5 is a combined block-pictorial representation of a means for depositing a thin layer on the solid substrate with ion beam sputtering;

FIG. 6 is a greatly enlarged perspective view of a solid substrate formed with regularly spaced steps according to the invention suitable for receiving an epitaxial or preferred orientation layer; and FIG. 7 is a sectional view illustrating the relief structure following etching of a substrate having sloping walls.

DETAILED DESCRIPTION OF PREFERRED EMBODIMENTS

With reference now to the drawing and more particularly FIGS. 1-4, there is illustrated a method for creating a relief structure on the surface of a solid according to the invention. The solid 1 is coated with a radiation sensitive polymer film 2 (commonly called a "resist") as seen in the fragmentary sectional view of FIG. 1. An example of such a film would be polymethyl methacrylate. This film may then be exposed by x-ray lithography (U.S. Pat. No. 3,743,842 (July 3, 1973) "X-ray Lithographic Apparatus and Process" H. I. Smith, D. L. Spears, E. Stern) as depicted in FIG. 2. The mask 3 consists of a membrane 4 which is relatively transparent to x-rays, and an absorber 5, which is formed into a pattern of periodic or quasiperiodic elements, such as a grating or grid. Soft x-rays 6 from source 7 pass through the mask 3, thereby casting a shadow of the absorber pattern 5 on the radiation sensitive polymer 2.

After exposure, a relief pattern is created in the radiation sensitive polymer by a development step. In the case of polymethyl methacrylate, development may be accomplished, for example in a solution of 40% methyl isolutyl ketone and 60% isopropyl alcohol, which removes these regions of the polymer directly exposed to the soft x-ray radiation. Those regions of the polymer 2 which were protected from the full intensity of the x-ray radiation by the obstruction of absorber pattern 5 remain undissolved and hence stand in relief, as depicted in FIG. 3. Many other radiation sensitive polymers and developing methods could be substituted within the principles of the invention.

The pattern can be exposed in the radiation sensitive polymer film by a number of other methods including photolithography, ion or electron beam lithography, and halographic methods. X-ray lithography is particularly well suited because of its capability of exposing patterns with linewidths of 1000 Å and less with sharp vertical sidewalls. It is estimated that a resolution of 50 Å is possible with x-ray lithography, using the Carbon K x-ray at 44.7 Å wavelength. Polymer relief structures can also be created by in-situ polymerization.

Following creation of the polymer relief structure 8, the solid substrate 1 is etched and the polymer is removed, thereby leaving a relief structure 9 on the surface of the solid as seen in FIG. 4. The method of etching depends on the chemical nature of the solid and the resistance of the polymer to various etching environments. For example, with PMMA as the polymer relief pattern, relief structures with sharp vertical sidewalls can be etched into $SiO_2$ substrates by a reactive ion etching process.

In addition to the process described above, wherein the polymer relief structure, 8, acts as a mask while a relief structure 9, is etched into the substrate, as shown in FIG. 4, an intermediate material may be used as the mask. For example, one could evaporate a thin film of chromium over the polymer relief structure and thereafter dissolve the polymer leaving behind a relief structure mask in chromium. If the substrate is fused silica, $SiO_2$, a relief structure with nearly square-wave cross section can be etched using such a chromium mask and reactive ion etching in either $CF_4$ or $CHF_3$ plasmas, such as described in the article "Surface relief structures with linewidths below 2000 Å" by D. C. Flanders, H. I. Smith, H. W. Lehmann, R. Widmer and D. C. Shaver, Applied Physics Letters, Vol. 32, p. 112, January 1978.

While steep vertical sidewalls are preferred, the principles of the invention are applicable to discontinuities formed by sloping sidewalls, including those formed by undercutting such as shown in FIG. 7. Alternatively, ion beam etching, wet chemical etching or gaseous plasma etching could be used for etching. Another approach to creating a relief structure on $SiO_2$ is to deposit $SiO_2$ or SiO, or a mixture of the two, over the polymer relief structure, and then dissolve the polymer in a suitable organic solvent. This leaves a relief structure of the $SiO_2$, SiO or mixture of the two on the surface. To convert the relief structure to a high quality $SiO_2$, the substrate can be baked in an oxygen over at or near 1000° C.

An array of artificial point defects can be created on the substrate surface by exposing it to radiation in some pattern. For example, a high energy finely focused electron beam can be scanned in an appropriate pattern over the sample surface creating lines of point defects. Alternatively, ion bombardment through a mask could be employed to create a pattern of defects. High energy photons could also be used. Another method of creating a relief structure in a surface is to directly etch it by bombardment with a finely focused ion beam.

Following the creation of the artificial relief structure or array of defects on the solid surface, material is deposited on top of it to form a thin film. The relief structure or array of defects has the effect of controlling the nucleation and/or growth of the film, thereby resulting in a film with a determined crystallographic orientation and low defect density. Many methods can be used to deposit thin film material on the solid with artificial surface relief structures or array of point defects. These include evaporation, rf sputtering, DC sputtering, ion beam sputtering, chemical vapor deposition, molecular beam deposition, plating and deposition from the liquid phase. Ion beam sputtering as depicted in FIG. 5 has been used, and the material deposited was germanium on $SiO_2$ substrate, a substrate of amorphous material. An ion source 10 emits an ion beam 11 which impinges on target 12 of the material to be deposited. The material 13 sputtered from the target 12 deposits on the substrate 1 with surface relief structure 9.

Following, or during, the deposition of a film over a solid surface, having in it artificial defects, it may be desirable in some cases to enhance the orienting influence of the artificial defects by subjecting the film to some form of energy input, or some special environmental conditions. In some cases, such energy input or environmental conditions might be essential in order that the geometric arrangement of adjacent artificial defects controls the crystallographic orientation of the film or a layer in the film. For example, after putting down a film the combination of substrate and film could obviously be heated to a high temperature in an oven, a process which is commonly called thermal annealing and is well-known to anyone skilled in the art of film growth or crystal growth. In general, such annealing is expected to enhance the orienting influence of the artificial defects. Other methods of annealing that could be employed include bombardment with electrons; irradiation with infrared, visible, ultraviolet or X-ray photons; bombardment with ions. In some case the overlayer film might be melted by the high temperature or energy input, but this is not essential in order to enhance the orienting influence of the artificial defects.

In some cases, the deposition or growth of the overlayer film takes place in special environmental conditions that would favor orientation controlled by the geometric arrangement of adjacent artificial defects. Three examples mentioned above were plating, which would take place in a plating solution, chemical vapor deposition, which would typically take place in an environment of reactive gases at elevated temperatures, and deposition from the liquid phase, which would include both growth within a solvent medium and growth from the molten phase.

As an example of special environmental conditions that may be necessary to achieve crystallographic orientation after film deposition, consider the case of a polymer that is able to form crystals. If a nonoriented film of the polymer is put down over a surface having appropriate artificial defects in it, the polymer may be oriented by placing it in a solution that invades the polymer, softens it or otherwise enhances the mobility of the polymer chains.

The following is an example of how the addition of energy to a film, after it had been deposited over a surface relief structure, was used to achieve crystallographic orientation controlled by the geometric arrangement of adjacent defects. A smooth fused silica substrate, $SiO_2$, was covered with a film of chromium about 200 Å thick. This was then coated with about 5000 Å of photoresist (such as AZ1350B, a product of the Shipley Company, Newton, Mass.) and exposed to ultraviolet light through a photomask having a grating pattern whose spatial period was 3.8 μm. The chromium was then etched in an aqueous chemical etchant. The $SiO_2$ substrate, masked by the chromium grating, was then etched to a depth of about 1000 Å by means of reactive ion etching. Following this, the chromium was removed by aqueous chemical means. Next, a thin film of silicon, about 5000 Å thick, was deposited over the relief structure in the $SiO_2$ by a chemical vapor deposition process in a commercial system designed for such silicon deposition. The temperature of deposition was chosen so as to yield an amorphous film of silicon. Following this, an argon ion laser beam was focused onto the silicon film and scanned over it, a process which has been called "laser annealing" or "laser crystallization." At an appropriate power density, which appears to be just below the threshold for melting, the silicon becomes crystallographically oriented by the artificial surface relief structure. It was found that the three <100> directions in the silicon are parallel and perpendicular to the grating, and perpendicular to the plane of the $SiO_2$ surface. In areas outside the grating such crystallographic orientation did not take place. Instead, many discrete crystallites were observed. These tended to have one of their three <100> directions perpendicular to the $SiO_2$ surface and the other two randomly directed in the plane of the surface. The above results demonstrate the principle of the invention and, moreover, demonstrate that a grating period of the order of 4 μm is adequate to induce crystallographic orientation on an amorphous substrate.

On crystalline substrates a separation distance less than 1 micron between adjacent defects is preferred, as described above, but may, in fact, not be essential. There may be cases where a separation distance greater than 1 micron is adequate.

The achievement of crystallographically oriented silicon on an amorphous $SiO_2$ surface can have enormously important applications ranging from microelectronic devices to solar cells. It should be possible, for example, to substitute an inexpensive amorphous substrate for the fused silica $SiO_2$ substrate. Single-crystal semiconductor films on such substrates, made in accordance with this invention, should be especially attractive as solar cells since they are likely to be much cheaper than solar cells made from conventional single-crystal silicon wafers. High cost of conventional solar cells is a major impediment to their widespread use for generating electricity.

The methods described above for creating surface relief structure were based on the planar process. Another method that could be used is molding. In this method, a relief structure is first produced in a master plate. This relief structure is then transferred to a second material by molding. For example, the master plate might be fused silica, graphite or a refractory metal such as chromium. The relief structure may be etched into the SiO2 by reactive ion etching as described above, and produced in the chromium by liftoff or by etching. Relief structure may be etched into graphite by a reactive ion etching process. A second material, such as a plastic, may then be pressed into the master plate. Plastic sufficiently soft and able to flow may fill the spaces of the master plate. Upon hardening and removal from the master plate, by peeling or other means, the plastic surface is a faithful replica of the master plate and thus may be used as a substrate for subsequent growth of a substantially epitaxial or preferred orientation layer, using the artificial relief structure to induce crystallographic orientation. This molding technique may produce artificial surface relief structure in non-plastic substrates such as glasses. Of course, the master plate need not be made of amorphous SiO2, graphite or a refractory metal. It could, for example, be a single crystal substrate. It is well-known that many single crystal substrates can be etched so that the resulting surface relief structure includes low index planes. The process is usually called anisotropic etching, and occurs when an etching solution etches into one crystallographic direction (such as the <100> direction) much more rapidly than into another (such as the <111> direction). Single-crystal silicon is an example of this, as described in the article "Anisotropic etching of silicon" by K. E. Bean in IEEE Transactions on Electron Devices, Vol. ED-25, p. 1185, October 1978. Another approach is to damage a single crystal substrate at predetermined locations and then chemically etch the substrate so as to leave an array of pits bounded by substantially planar facets corresponding to crystallographic planes.

While the invention is useful for making devices with thin films 0-3 microns thick, the invention is also useful for growing larger crystals. The initial thin film may then function as a seed and larger crystals grown using conventional crystal growing techniques.

Referring to FIG. 6, there is shown a greatly magnified perspective view of a substrate regularly stepped according to the invention ready for receiving an epitaxial or preferred orientation surface layer. There are sets of steps each embraced by a plane parallel to the plane embracing another set of steps. Intersecting embracing planes intersect at an angle of 90° or π/2 radians, an integral multiple of 30° or π/6 radians. The planes might also intersect at an angle of 60° or π/3 radians, also an integral multiple of 30° or π/6 radians. It is also preferred that separation between adjacent parallel embracing planes be less than 1 micron, typically being 500 Angstroms as shown in FIG. 6 or 1/20 micron. The artificial step or point defect depth is preferably within the range of 1 atom or ½ micron.

Reference to the geometric arrangement of adjacent ones of artificial defects includes both the shape or form of a single defect and the relative position of an adjacent defect in terms of bearing and distance. The crystallographic orientation in the film on the substrate surface being controlled by adjacent ones of the artificial defects includes situations when adjacent ones of artificial defects exercise some material influence on the orientation of the film portion between the adjacent defects.

There has been described novel structure and techniques for providing epitaxial and preferred orientation films of relatively large area with an economically practical repeatable process. It is evident that those skilled in the art may now make numerous uses and modifications of and departures from the specific structure and techniques disclosed herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A method of enhancing epitaxy and preferred orientation which method includes the steps of intentionally forming at predetermined locations a plurality of artificial defects having predetermined geometric form at the surface of a solid substrate, with said artificial defects being selected from the group consisting of (1) artificial point defects and (2) artificial surface relief structure, the separation between adjacent artificial defects being sufficiently small so that both artificial defects in a pair of adjacent ones contribute to influencing said crystallographic orientation, and thereafter depositing a film on said surface to form a substantially epitaxial or preferred orientation layer in said film having crystallographic orientation materially influenced by the geometric arrangement of adjacent artificial defects by a process in which the formation of crystalline regions and any changes in crystallographic orientation occur while material forming said film is in contact with said artificial defects.

2. A method of enhancing epitaxy and preferred orientation in accordance with claim 1 and further including the step of maintaining the separation between rows of artificial defects substantially equal.

3. A method of enhancing epitaxy and preferred orientation in accordance with claim 1 and further including the step of establishing said artificial defects in intersecting rows.

4. A method of enhancing epitaxy and preferred orientation in accordance with claim 3 and further including the step of maintaining the separation between parallel rows substantially equal.

5. A method of enhancing epitaxy and preferred orientation in accordance with claim 1 and further including the step of forming artificial point defects among said artificial defects.

6. A method of enhancing epitaxy and preferred orientation in accordance with claim 1 and further including the step of forming artificial steps among said artificial defects.

7. A method of enhancing epitaxy and preferred orientation in accordance with claim 6 and further including the step of spacing said artificial steps substantially equidistant.

8. A method for enhancing epitaxy and preferred orientation in accordance with claim 6 and further including the step of forming artificial steps that are substantially orthogonal to the first-mentioned artificial steps.

9. A substrate having an epitaxial or preferred orientation layer on the substrate surface made in accordance with the method of claim 1.

10. A method of enhancing epitaxy and preferred orientation in accordance with claim 1 and further including the step of forming said artificial defects with the dimension of each defect in a direction perpendicular to the substrate surface being within the range of 1 atom to ½ micron.

11. A method of enhancing epitaxy and preferred orientation in accordance with claim 3 and further including the step of establishing said artificial defects in rows that intersect at an angle that is an integral multiple of $\pi/6$ radians.

12. A method of enhancing epitaxy and preferred orientation in accordance with claim 3 and further including the step of forming artificial point defects among said artificial defects.

13. A method of enhancing epitaxy and preferred orientation in accordance with claim 3 and further including the step of forming artificial steps among said artificial defects.

14. A substrate having an epitaxial or preferred orientation layer on the substrate surface in accordance with claim 10 wherein the dimension of each artificial defect in a direction perpendicular to the surface of said substrate is within the range of 1 atom to ½ micron.

15. A method of enhancing epitaxy and preferred orientation which method includes the steps of intentionally forming at predetermined locations a plurality of artificial defects having predetermined geometric form at the surface of an amorphous solid substrate, said artificial defects being selected from the group consisting of (1) artificial point defects and (2) artificial surface relief structure, and thereafter depositing a film on said surface to form a substantially epitaxial or preferred orientation layer in said film having crystallographic orientation materially influenced by the geometric arrangement of adjacent artificial defects by a process in which the formation of crystalline regions and any changes in crystallographic orientation occur while material forming said film is in contact with said artificial defects.

16. A substrate having an epitaxial or preferred orientation layer on the substrate surface made in accordance with claim 15 comprising, an amorphous solid substrate having a surface with intentionally formed artificial defects at predetermined locations, said layer in said film having crystallographic orientation determined by the geometric arrangement of adjacent artificial defects.

17. The product in accordance with claim 16 wherein said amorphous solid substrate is plastic.

18. The product of claim 16 wherein said substrate is silicon dioxide and said layer comprises at least one of silicon and germanium.

19. The product in accordance with claim 16 wherein said substrate comprises silicon dioxide and said layer comprises gallium arsenide.

20. The product in accordance with claim 16 wherein said layer is of different material than said substrate.

21. A method of enhancing epitaxy and preferred orientation in accordance with claim 6 wherein said steps have substantially vertical walls.

22. A method of enhancing epitaxy and preferred orientation in accordance with claim 6 wherein said steps have sloping walls.

23. A substrate in accordance with claim 1 wherein said substrate is amorphous and said layer is semiconductive.

24. A method of enhancing preferred orientation in accordance with claim 1 and further including subjecting the film and substrate to conditions for enhancing the orienting influence of said artificial defects.

25. A method of enhancing preferred orientation in accordance with claim 24 wherein said conditions comprise environmental conditions.

26. A method of enhancing preferred orientation in accordance with claim 25 wherein said conditions include conditions comprising at least one of
(1) placing said film and substrate in a plating solution,
(2) placing said film and substrate in an environment of reactive gases at elevated temperatures,
(3) placing said film and substrate within a solvent medium, and
(4) placing said film and substrate in a solution that invades the said film, softens it, or otherwise enhances the mobility of molecules in the film.

27. A method of enhancing preferred orientation in accordance with claim 24 wherein said conditions include delivering energy to said film.

28. A method of enhancing preferred orientation in accordance with claim 27 and further including the step of subjecting the film to elevated temperature.

29. A method of enhancing preferred orientation in accordance with claim 15 and further including subjecting the film and substrate to conditions for enhancing the orienting influence of said artificial defects.

30. A method of enhancing preferred orientation in accordance with claim 29 wherein said conditions comprise environmental conditions.

31. A method of enhancing preferred orientation in accordance with claim 30 wherein said conditions include conditions comprising at least one of
(1) placing said film and substrate in a plating solution,
(2) placing said film and substrate in an environment of reactive gases at elevated temperatures,
(3) placing said film and substrate within a solvent medium, and
(4) placing said film and substrate in a solution that invades the said film, softens it, or otherwise enhances the mobility of molecules in the film.

32. A method of enhancing preferred orientation in accordance with claim 29 wherein said conditions include delivering energy to said film.

33. A method of enhancing preferred orientation in accordance with claim 32 and further including the step of subjecting the film to elevated temperature.

34. A method in accordance with claim 1 wherein said artificial surface relief structure comprises structure having a preselected shape bounded by substantially planar facets.

35. A substrate in accordance with claim 10 wherein said artificial surface relief structure comprises structure having a preselected shape bounded by substantially planar facets.

36. A method of enhancing preferred orientation in accordance with claim 24 wherein said artificial defects comprise material different from that of said substrate.

37. A device comprising,
a solid substrate having a surface with artificial defects having predetermined geometric form selected from the group consisting of (1) artificial point defects and (2) artificial relief structure,
and a film on said surface including a substantially preferred orientation layer with crystalline regions formed or changed while material of said film was in contact with said artificial defects and having crystallographic orientation influenced by adjacent ones of said artificial defects, the separation between adjacent ones of said artificial defects being sufficiently small so that both artificial defects in a pair of adjacent ones contribute to influencing said crystallographic orientation.

38. A substrate in accordance with claim 1 wherein said layer is semiconductive.

* * * * *